United States Patent [19]

Jayant

[11] Patent Number: 4,513,426
[45] Date of Patent: Apr. 23, 1985

[54] ADAPTIVE DIFFERENTIAL PULSE CODE MODULATION

[75] Inventor: Nuggehally S. Jayant, Short Hills, N.J.

[73] Assignee: AT&T Bell Laboratories, Murray Hill, N.J.

[21] Appl. No.: 451,487

[22] Filed: Dec. 20, 1982

[51] Int. Cl.³ .............................................. H04B 12/04
[52] U.S. Cl. ........................................ 375/26; 375/27; 375/38
[58] Field of Search ................... 375/26, 27, 34, 122, 375/25, 33, 30, 38; 340/347 M, 347 CC; 332/11 R; 358/13

[56] References Cited

U.S. PATENT DOCUMENTS

| | | | |
|---|---|---|---|
| 2,516,587 | 7/1950 | Peterson | 375/26 |
| 3,573,364 | 4/1971 | Shimamura | 375/33 |
| 4,005,274 | 1/1977 | Vagliani et al. | 375/26 X |
| 4,099,122 | 7/1978 | Buul | 375/33 |
| 4,319,360 | 3/1982 | Cointot | 375/27 |

OTHER PUBLICATIONS

Bell System Technical Journal, "Adaptive Quantization in Differential PCM Coding of Speech" by P. Cumminskey, N. S. Jayant and J. L. Flanagan, Sep. 1973, vol. 52, No. 7, pp. 1105-1118.

Primary Examiner—Benedict V. Safourek
Attorney, Agent, or Firm—Joseph P. Kearns; John K. Mullarney

[57] ABSTRACT

A differential pulse code modulation system is made adaptive to quantization noise in a way which permits variable-rate operation as either a conventional R-bit embedded code or as a combination of a conventional R-bit code and a further explicit noise code with instantaneous quantization. Additional improvement in signal-to-noise ratio is attainable by using a noninstantaneous variable-bit allocation procedure for equal-length sampling blocks with an averaged fixed bit code.

2 Claims, 8 Drawing Figures

ANALOG INPUT

RECONSTRUCTION ERROR
WITHOUT EXPLICIT CODING

RECONSTRUCTION ERROR
WITH EXPLICIT CODING

RECONSTRUCTION ERROR
WITH VARIABLE BIT ALLOCATION

ADAPTIVE DIFFERENTIAL PULSE CODE MODULATION

TECHNICAL FIELD

This invention relates to differential pulse code modulation systems incorporating adaptive step sizing and, more particularly, to explicit coding of quantization noise in such systems with and without variable bit allocation.

BACKGROUND OF THE INVENTION

Known differential pulse code modulation (DPCM) communications systems for speech coding, for example, are made adaptive in step sizes from sample to sample in order to compensate for two types of quantization error: slope overload distortion and granular noise. These types of quantization error reflect situations where the quantizer step size is either too small or too large relative to the amplitude change occurring between samples. The solution has been to increase step size during overloads and to decrease it during granularity. The practice has been to increase and decrease the step size by preselected multipliers, thus expanding and contracting the dynamic quantization range without changing the number of encoding bits per step or the uniform spacing between them. Where step size is adjusted after each sample, the quantization is said to be instantaneous. Where step size is adjusted at longer than sample intervals, the quantization is said to be noninstantaneous or syllabic.

A DPCM coding system in which the step size is changed in accordance with the amplitude of the latest sample, or of an average of a block of samples, is said to be adaptive and becomes known as an adaptive DPCM or ADPCM coding system. Such a system is described by P. Cummiskey, N. S. Jayant and J. L. Flanagan in the paper "Adaptive Quantization in Differential PCM Coding of Speech" (*Bell System Technical Journal*, Vol. 52, No. 7, pp. 1105–1118, September 1973).

FIG. 1 of this paper constitutes a block diagram of an ADPCM system on which the present invention is an improvement. The analog signal at the input to the system is first sampled at a constant rate, e.g., at the Nyquist rate; the samples are next quantized; and then the quantization levels are converted into a binary code for transmission to a remote receiver. The samples are also sent through an integrator loop to reconstruct the original signal. In selecting the first sample, the difference between each reconstructed previous signal, necessarily a less than perfect replica of the original signal due to the quantization, and the next signal sample is continuously applied to the quantizer whose output becomes the transmitted signal. According to the quantization level or slot occupied by the previous difference signal, the quantization levels are expanded or contracted uniformly on an empirical basis before the next difference sample is encoded. At a decoder the reverse of the encoding procedure is accomplished to reconstruct the original analog signal.

The principal advantage of the ADPCM coding system is the minimization of the number of bits needed to transmit the encoded signal as compared to the number of bits required, for example, for conventional eight-bit PCM. The example in the cited paper uses three bits for each difference sample. The number of bits per sample is herein generalized as R-bits. For the three-bit coding there are eight possible levels arranged symmetrically about a reference level. Corresponding to each level a multiplier is assigned to expand the dynamic range of the system when the previous signal is quantized on an outer level and to contract such range when the previous signal is quantized on an inner level.

PCM coders have a property of interest to the present disclosure known as embedded coding. A digital code that admits simple bit dropping and reinsertion is called an embedded code. An eight-bit PCM word can be truncated, for example, by dropping less significant bits to accommodate a slower speed channel and deliver a coarser, but recognizable, signal to a receiver. DPCM, on the other hand, is not an embedded code because dropping bits generates errors in the feedback path around the quantizer in both transmitting and receiving terminals. An embedded code is useful where a variable rate channel must be accommodated. Reducing the number of bits per sample reduces signal quality at a lower signaling rate per word. Increasing the number of bits per sample increases signal quality but either reduces the overall signaling rate or requires a higher speed channel. p It is an object of this invention to provide a variable rate ADPCM transmission system.

It is another object of this invention to provide explicit reconstruction or quantization noise coding in an ADPCM transmission system.

SUMMARY OF THE INVENTION

According to my invention, an adaptive differential pulse code modulation transmission system is modified to combine explicit reconstruction, i.e., quantization, noise coding with conventional coding of the signal samples themselves. By way of specific example, R-bits are used for coding signal samples and one bit is used for coding noise samples. This modification allows for dual rate transmission either at the conventional rate or at the enhanced rate including the noise coding. When the noise coding is included, the signal-to-noise ratio (SNR) is markedly greater than with a conventional ADPCM system using the same number of bits per sample.

In one illustrative embodiment of the invention the reconstruction noise coding is practiced on an instantaneous basis, i.e., one output code for each sample.

In another illustrative embodiment of the invention the reconstruction noise coding is practiced on a block or noninstantaneous basis and the number of bits per noise sample is allocated according to its magnitude in a way that the average number of bits per noise sample over the block length is maintained at the uniform value that would otherwise be assigned on an instantaneous basis. The allocation involves a rank ordering of the signal samples across the block of samples. In the case of conventional 3-bit coding of signal samlples and a one-bit coding of noise samples, an assignment is made of the largest number of bits per sample, i.e., 3, to the noise coding corresponding to large noise samples during slope overload, no bits in correspondence with the noise samples of smallest magnitude, and a single bit to the remaining noise samples of intermediate magnitude. An improvement in signal-to-noise ratio (SNR) over both conventional ADPCM coding and enhanced ADPCM coding of the first embodiment results. No communication delay is inroduced in the conventional coding, and only one block length of delay is thereby incurred for enhanced coding.

The dual-rate ADPCM system of this invention based on an explicit coding of reconstruction noise provides an approach to embedded coding in situations where the bit rate in a digital speech channel is expected to be varied from time to time by no more than one bit per sample. No additional side information is required to be transmitted.

BRIEF DESCRIPTION OF THE DRAWING

The objects, advantages, and features of this invention will be more fully appreciated from the following detailed description and the drawing in which.

DETAILED DESCRIPTION

Figure 1:
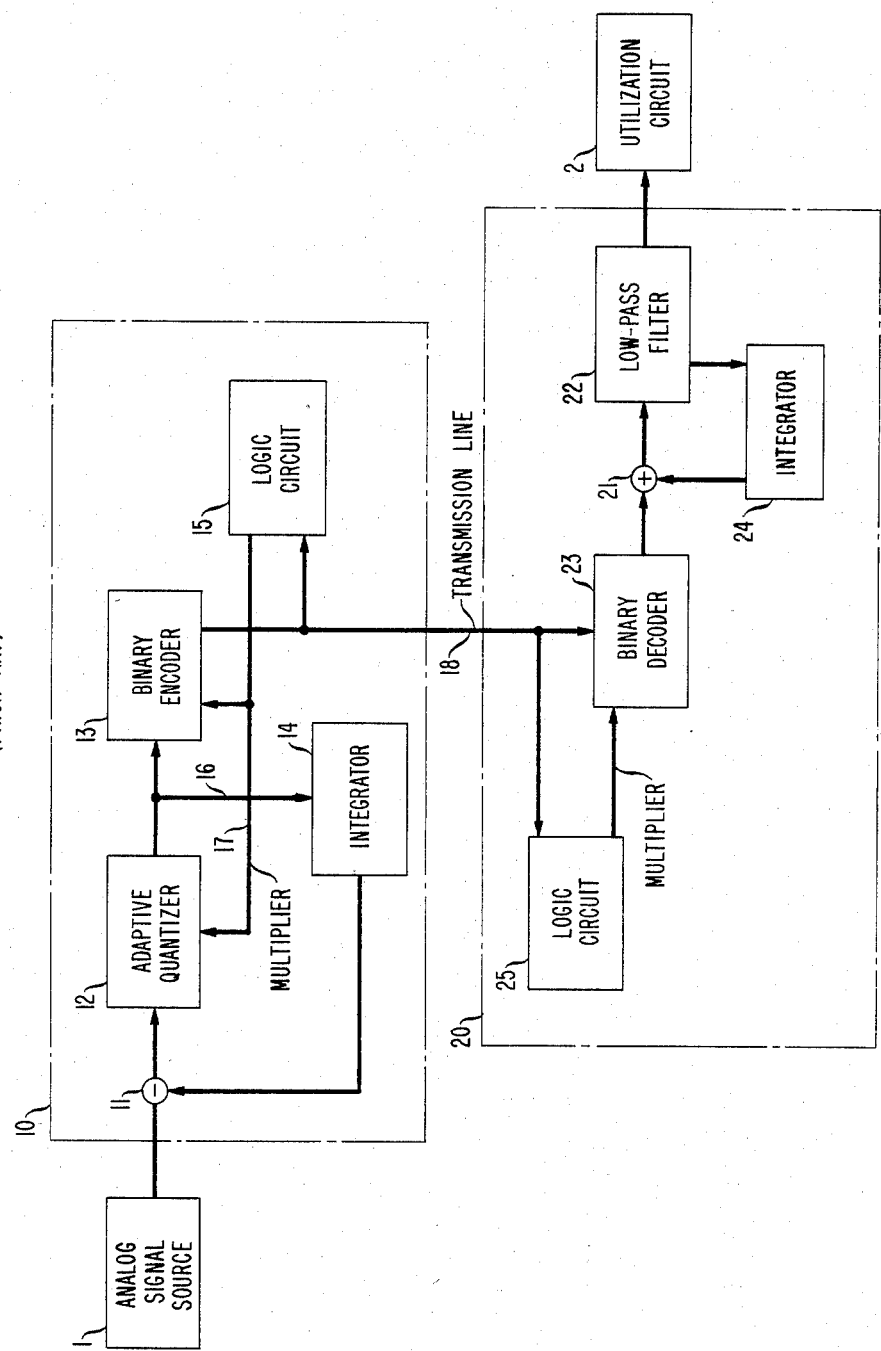
FIG. 1 is a block schematic diagram of an adaptive differential pulse code modulation (ADPCM) known to the prior art.

FIG. 1 depicts an ADPCM system known to the prior art as exemplified by the cited Cummiskey et al. paper. In the known system an analog signal, such as human speech, is first sampled at a sufficient rate, typically at 8 kiloHertz (kHz) and then the difference between the present sample and the reconstruction of one or more previous quantized samples is itself quantized against a plurality of uniformly spaced discrete signal levels. In order to compensate for differences in adjacent sample levels provision is made for adaptive variation of the uniform spacing of the quantization levels for the present sample in accordance with the level occupied by one or more previous samples. The purpose for the adaptive step sizing is to increase the step size for potential overload distortion and to decrease it for low-level granular distortion.

The ADPCM system of FIG. 1 broadly comprises analog signal source 1, encoder 10, transmission line 18, decoder 20 and utilization circuit 2. Encoder 10 further comprises subtractor 11, adaptive quantizer 12, binary encoder 13, integrator 14 and logic circuit 15. Decoder 20 further comprises binary decoder 23, logic circuit 25, adder 21, integrator 24 and low-pass filter 22.

An analog signal, such as a speech signal, is sampled at a rate exceeding the Nyquist rate and presented at the output of source 1 to coder 10. At the input to coder 10 subtractor 11 acts on the samples before application to quantizer 12 to generate difference vaues.

Figure 2:
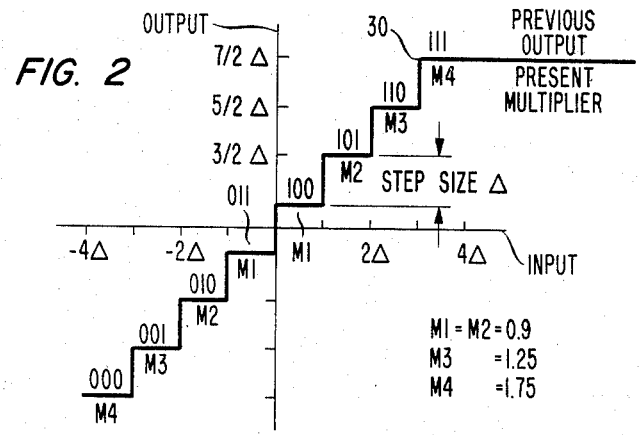
FIG. 2 is a diagram showing the relationships among the quantizing steps and step-size multipliers in a 3-bit ADPCM quantizer.

Quantizer 12 has a characteristic of the type diagrammed in FIG. 2. The eight evenly spaced discrete levels are shown along staircase 30. For this number of levels a minimum of three bits is required to describe each level uniquely. A uniform number R of bits is needed to define each level, where the number of levels is 2 raised to the Rth power. For the eight levels shown in FIG. 2 the value of R is 3. The abscissa, in FIG. 2 representing levels of input samples applied to quantizer 12, is laid off in even increments $\Delta$. The ordinate, representing output quantization levels, is also laid off in equal steps $\Delta$. An input sample of amplitude lying between 0 and $\Delta$ is coded as binary 100; between $\Delta$ and $2\Delta$ as 101, and so forth. Negative samples are similarly coded, as indicated in FIG. 2, down to the minimum level designated 000.

The actual output of quantizer 12 is a pulse at one of the allowable discrete levels. These pulses are applied to integrator 14 over lead 16 and to binary encoder 13. Integrator 14, also referred to as a linear predictor, accumulates outputs of quantizer 12 and by being updated by each quantized sample continually reconstructs the input sample at the quantized level. Its output is continually subtracted from the input samples so that after the first sample, the value applied to quantizer 12 is the error difference between the present sample and the reconstruction of all past samples. It is this continuing error difference which is quantized, and not the full sample amplitude.

Binary coder 13 in turn acts on the quantization levels applied to it from quantizer 12 and emits the bits representing the current level to transmission line 18 and to logic circuit 15. Logic circuit 15 is in effect a translator between an R-bit code (from encoder 13) and a multiplier value. FIG. 2 shows at each of the eight steps of the diagram a multiplier designated M1 through M4. It is to be noted that these multipliers are applied symmetrically to positive and negative sample values. These multipliers are applied to the last used step size $\Delta$ to contract or expand the diagram of FIG. 2 equally in both horizontal and vertical directions. The multipliers are chosen empirically so that, in general, the inner multipliers such as M1 and M2 are less than one and the outer multipliers M3 and M4 are greater than one. Thus, the assumption is made that large samples will likely be followed by another large sample and small samples will likely be followed by another small sample. In this way the dynamic range of the quantizing system tends to match the sample amplitudes and to remain susceptible to coding with R-bits only. The multipliers found to be effective in an (R=3)-bit system are on the order of M1=0.9, M2=0.9, M3=1.25 and M4=1.75. Other values can be adopted in accordance with the robustness or signal-to-noise ratio (SNR) desired.

Logic circuit 15 translates the R-bit code defining each output of encoder 13 into the multiplier value assigned to that output level and applies that multiplier value over lead 17 to binary encoder 13 and adaptive quantizer 12. Adaptive quantizer 12 responds by adjusting its thresholds to the product of the previous thresholds and the multiplier whereby the overall dynamic range of the system is uniformly expanded or contracted. Binary encoder 13 responds by adjusting its R-bits for each step to the updated quantizer thresholds. Each R-bit code applied to transmission line 18 corresponds to a difference signal level determined by the current thresholds in quantizer 12.

Decoder 20 has at its input binary decoder 23 and logic circuit 25. Except for transmission line noise, the signal applied to binary decoder 23 and logic circuit 25 is the same as that at the output of binary coder 13. Logic circuits 15 and 25 thus operate on substantially the same signal. Consequently, logic circuit 25 is of the same structure as logic circuit 15 and provides the same multiplier value to decoder 23. Decoder 23 generates substantially the same signal levels as adaptive quantizer 12 in encoder 10.

The discrete signals at the output of decoder 23 are combined in adder 21 with the accumulation (remembering that the signals from decoder 23 can be either positive or negative) of prior signals from integrator or predictor 24, which is of the same structure as integrator 14 in coder 10. The reconstructed output of adder 21 is passed through low-pass filter 22 to form a smoothed replica of the originally transmitted analog signal for application to utilization circuit 2.

Figure 3:
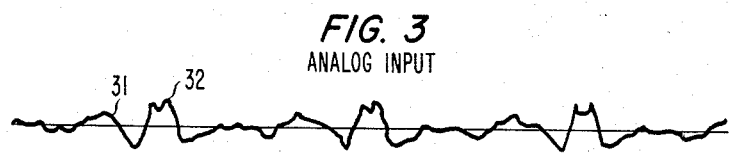
FIGS. 3 through 6 are waveforms of an analog speech phrase in its original form, an error waveform after reconstruction by conventional ADPCM, an error waveform after reconstruction in conjunction with explicit instantaneous noise coding according to this invention, and an error waveform after reconstruction in conjunction with explicit noise coding using variable bit allocation.

FIG. 3 is a waveform diagram of a representative 16-millisecond analog voice segment 31 emitted by signal source 1. Peak 32 represents a possible overload burst of energy within the segment which an ADPCM system is designed to smooth.

Figure 4:
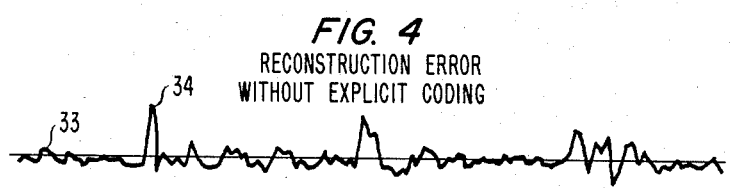

FIG. 4 illustrates the reconstruction error waveform 33 that results from the operation of the conventional ADPCM system of FIG. 1 on the signal of FIG. 3. A burst 32 from FIG. 3 is sharpened and reduced in duration, but the narrow spike 34 remains in FIG. 4 even with encoding at R=4. In voiced speech, it has been observed, the time separation between slope overload bursts corresponds closely to the pitch period. In FIG. 4 the separation is approximately five milliseconds, which indicates a pitch of 200 Hz. It is apparent from FIG. 4 that reconstruction or quantization noise remains significant with conventional ADPCM coding. Finer quantization would appear to be necessary in order to eliminate, if possible, impulsive components, such as that designated 34 in FIG. 4.

Figure 7:
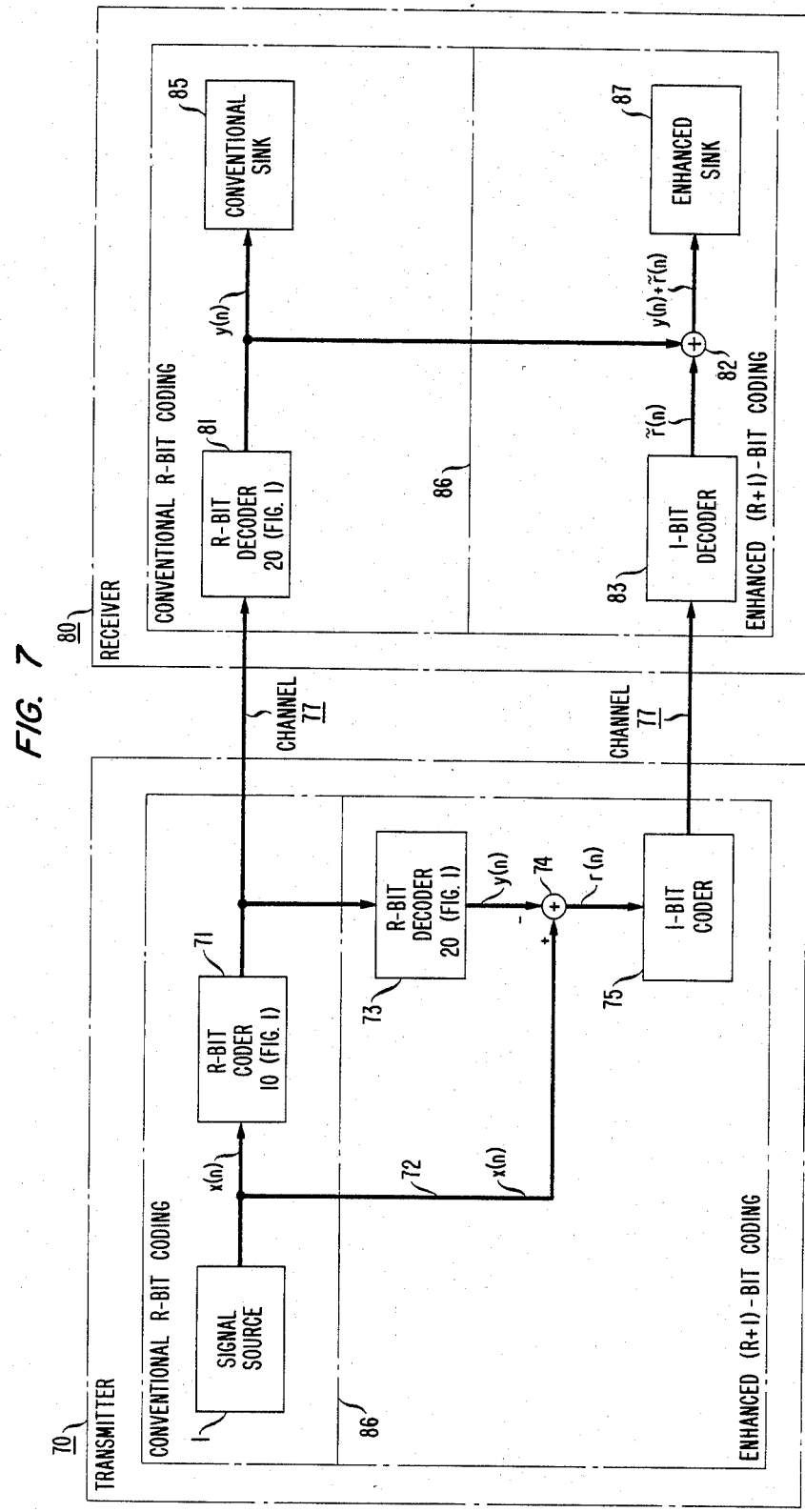
FIG. 7 is a block schematic diagram of an enhanced ADPCM system using instantaneous noise coding according to this invention.

FIG. 7 is a block diagram of a dual-rate coding system according to one embodiment of this invention. The portion of FIG. 7 lying above dashed line 86 is the principal conventional R-bit ADPCM coding system or codec (COder-DECoder). The portion of FIG. 7 lying below dashed line 86 performs explicit single-bit coding of reconstruction noise samples. To the left of channel 77 appears transmitter 70, which comprises analog signal source 1, as in FIG. 1 for providing digital samples x(n), and R-bit coder block 71. The samples x(n) are operated on in block 71, which is substantially the conventional coder 10 from FIG. 1. After traversing channel 77 the coded ADPCM samples are decoded in receiver 80 comprising block 81, which is substantially the conventional decoder 20 from FIG. 1, and sink 85. The decoder samples y(n) are delivered to conventional sink 85.

Below line 86 an enhanced noise coding signal is generated from the difference between the input sample x(n) and the reconstructed quantization signal y(n). Such difference is called reconstruction noise r(n). Thus, $$r(n) = x(n) - y(n) \qquad (1)$$

To implement equation (1), the original signal sample is reconstructed as signal y(n) from the R transmitted bits in decoder 73, which is identical in structure to R-bit decoder 81 in receiver 80 and to decoder 20 in FIG. 1. The subtraction of reconstruction signal y(n) from input sample x(n) takes place in subtractor or combiner 74. The output r(n) can be either positive or negative. Signal r(n) is then encoded in coder 75 as a 1 or 0 (for one-bit noise coding) according to whether it is positive or negative. This signal traverses channel 77 to receiver 80, where it is decoded in one-bit decoder 83, a straightforward binary slicer, into a positive or negative pulse of amplitude r(n). The magnitude of r(n) is in fixed proportion to the step-size Δ employed in the conventional coder above line 86. A proportioning factor of 0.25 has been found to afford an optimum SNR value. Noise signal r(n) is combined with conventionally recovered signal y(n) in adder 82 to form an enhanced signal for delivery to sink 87.

The enhanced noise coding system of FIG. 7 employs instantaneous quantization, i.e., quantization at every sampling instant. The quantization characteristic 30 (shown in FIG. 2) is multiplicatively expanded or compressed at every sampling instant by a factor M that depends on the magnitude of the most recent quantizer output y(n−1). Thus, the current step size becomes $$\Delta(n) = M[y(n-1)] \cdot \Delta(n-1) \qquad (2)$$

The function M takes on 2 exp (R−1) values in R-bit ADPCM because of symmetry about the zero axis.

The coding system of FIG. 7 can be operated at an R-bit rate as a conventional ADPCM system or at an enhanced (R+1)-bit rate with explicit noise coding.

Figure 5:
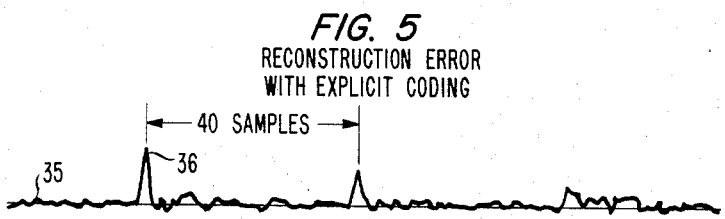

FIG. 5 shows the residual error in the enhanced signal developed in the system of FIG. 7 when explicit one-bit noise coding is employed. The low level granular background noise components are uniformly reduced. Unfortunately, slope overload impulsive components are moderated only slightly.

Figure 8:
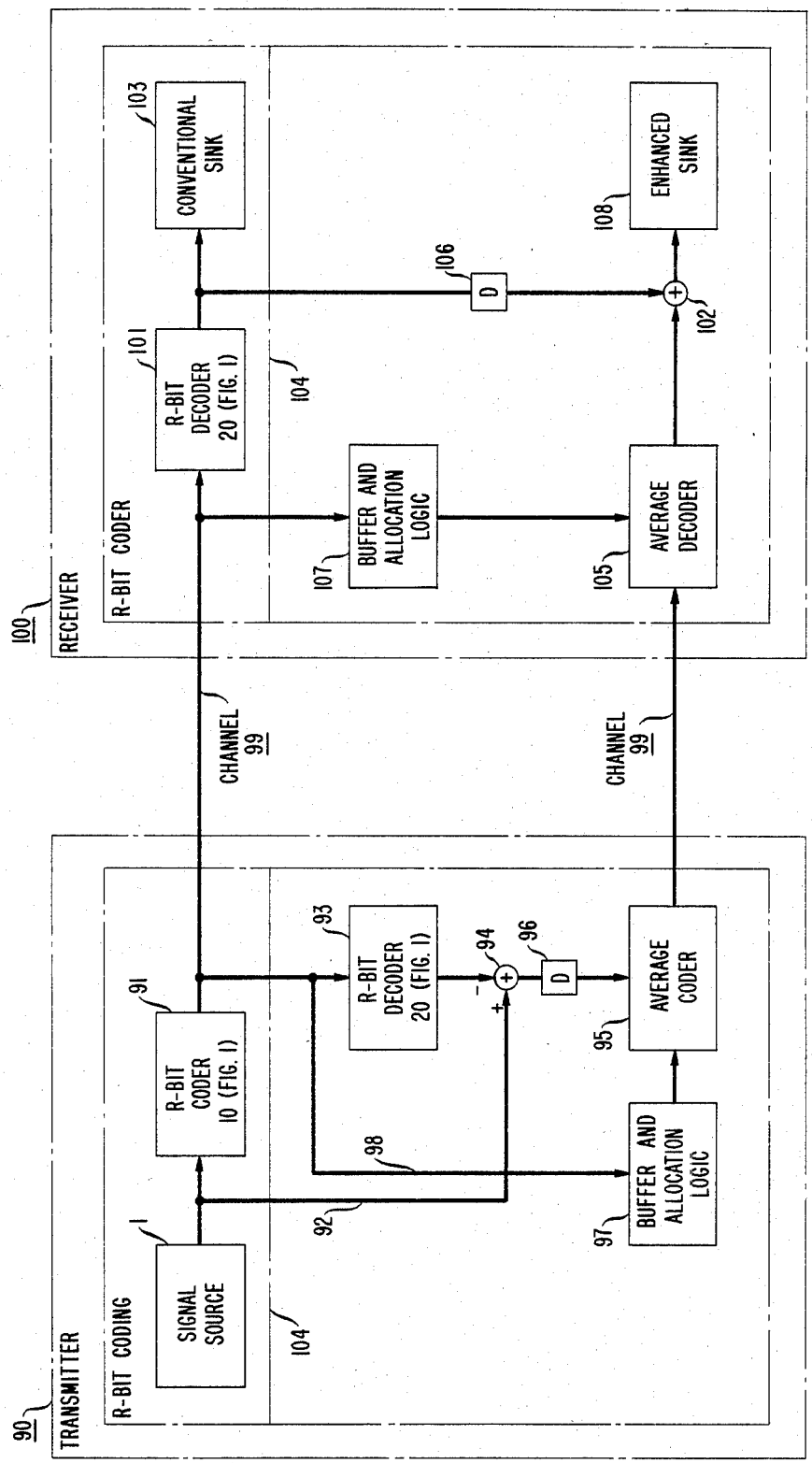
FIG. 8 is a block schematic diagram of an enhanced ADPCM system using noise coding with variable bit allocation according to this invention.

Elimination of the slope overload components evidently requires finer quantization. This might be accomplished by using more than one bit for each noise sample uniformly. FIG. 8 shows how this can be accomplished in an equally effective manner by selectively applying an effective R value greater than one in the noise coder to slope-overload components without increasing the average number of bits per sample for noise coding above one. This is accomplished by assigning the largest value of R used in the principal coder for slope overload components, zero bits to granular components, and only one bit for enough intermediate-level components to maintain an average of one bit per sample overall. It then becomes necessary to examine the input samples in fixed-length blocks, i.e., noninstantaneously, in order to allocate the number of bits per sample between slope overload, granular noise and other samples within each block to maintain the desired unitary average. An N-sample buffer is added in both transmitter and receiver for this purpose.

FIG. 8 shows a further embodiment of an enhanced ADPCM coding system according to this invention which employs noninstantaneous quantization combined with variable bit allocation for explicit noise coding. The embodiment of FIG. 8 broadly comprises transmitter 90, channel 99 and receiver 100. As in the embodiment of FIG. 7, R-bit conventional ADPCM coding is provided in a principal channel above line 104 and enhanced coding, below that line. R-bit coder 91 is substantially the same in function and structure as coder 10 in FIG. 1. Similarly, R-bit decoder 101 is substantially the same in function and structure as decoder 20 in FIG. 1. As in a conventional ADPCM system analog signals from signal source 1 are encoded for transmission over channel 99 in coder 91 and decoded by decoder 101 for reconstruction and delivery to sink 105. No communication delay is incurred for encoding and decoding above line 104.

Below line 104 the reconstruction coding portion is improved over that shown in FIG. 7 by the addition of buffer 97 in transmitter 90 and of buffer 107 in receiver 100. R-bit decoder 93 and subtractor 94 in transmitter 90 are substantially the same in structure and function as decoder 73 and subtractor 74 in FIG. 7. However, coder 95 and decoder 105 differ from coder 75 and decoder 83 in FIG. 7 in their ability to code and decode at R-bit, one-bit and zero-bit levels. Coder 95 and decoder 105 more closely correspond to coder 13 and decoder 23 in FIG. 1. In addition fixed delay units 96 and 106 are necessary to maintain the principal and noise channels in synchronism. Buffers 97 and 107 and fixed delay units 96 and 106 provide the same amount of delay based on the selected block length.

Buffer 97 in transmitter 90 continuously stores N-length blocks of sample code bits from coder 91 over lead 98. Since each sample contains R-bits, the total storage capacity is (N.R) bits. When the buffer is full, allocation logic provided by programmed microprocessor means, for example, applies the allocation algorithm to generate appropriate quantization procedures for the noise samples currently stored in the block. According to the allocation algorithm, the maximum number of bits used in coder 95 for encoding each maximum level noise sample, a single bit to intermediate level samples and zero bits for all other samples such that the total number of bits per block is the same as the block length. In order to maintain synchronism between the main channel and the noise channel without altering the main channel, delay unit 96 in series between subtractor 94 compensates for the delay in buffer 97 and delay unit 106 in series between the output of decoder 101 in the main channel and adder 102 compensates for the delay between the main and noise channels in receiver 100. Average coder 95 operates on the delayed noise samples from subtractor 94 in accordance with the allocated bits to generate a noise-coded bit stream for application to channel 99. Due to the variable-bit allocation algorithm the largest noise samples are encoded by the larger number of R-bits and intermediate samples by single bits. All other samples are ignored to generate a maximum number of N noise-coding bits, the same number of bits that would have been used if all noise samples were instantaneously encoded with only one bit per sample.

At receiver 100 the same buffering operation and generation of variable numbers of coding bits per sample occurs in buffer and allocation logic 107 with respect to the main channel received coded signals as in buffer 97. Thus, the same quantization procedures generated in buffer 97 are regenerated in buffer 107, subject only to such errors as may be due to noise in channel 99. These procedures are applied to decoder 105, which produces quantized noise components representative of the reconstruction error in the original differential encoding. The time relationship between the main channel signal and the noise signal in view of the presence of buffer 107 is maintained by delay unit 106. The reconstructed noise from decoder 105 is applied to combiner 102. For enhanced coding below line 104 only one block length of delay is introduced.

The principal channel digital signal is applied to decoder 101 and decoded in a conventional manner in analog form for further application either to sink 103 or through delay unit 106 to combiner 102.

For an enhanced analog signal reconstruction the noise signal from decoder 105 and the delayed principal signal from decoder 101 are combined in combiner 102 to produce an enhanced output signal for sink 108. Either the R-bit coded signal at conventional sink 103 or the (R+1)-bit enhanced signal at enhanced sink 108 can be selected at receiver 100, as desired.

Figure 6:

FIG. 6 is a waveform diagram of the enhanced signal produced by the circuit of FIG. 8. It will be observed that the impulsive components, such as that designated 37, have been brought under control as a result of the R-bit encoding of high-level noise samples, as compared with single-bit encoding of lesser samples. It has been found that there is a significant improvement in SNR over both conventional ADPCM (R+1)-bit coding, e.g., as in FIG. 1, and instantaneous explicit noise coding, e.g., as in FIG. 7.

While this invention has been described in terms of specific illustrative embodiments, various modifications such as, multibit noise coding for multiple-rate systems, will occur to those skilled in the analog signal, both audio and video, encoding art within the spirit and scope of the appended claims.

What is claimed is:

1. In an adaptive differential PCM (ADPCM) transmission terminal wherein an input source signal is converted into a quantized differential PCM output signal, a difference circuit to which samples of the input signal and a signal estimate of the same are coupled, said difference circuit providing an output difference signal indicative of the difference between the two inputs thereto, an integrator means for producing said signal estimate, adaptive quantizing and encoding means for receiving said difference signal and providing at its output a quantized differential PCM encoded version of the difference signal, said differential PCM coded output comprising R-bit DPCM signals, means for carrying out a noninstantaneous, explicit and separate coding of quantization noise comprising at the transmission terminal means for reconstructing a replica of said source signal from its quantized differentially encoded version, means for subtracting the replica of said source signal formed by the reconstructing means from said source signal to obtain a quantization noise error signal, buffer means for storing a predetermined number N of R-bit DPCM signals, average coder means for digitally coding samples of said quantization noise error signal into R-bits per sample, one bit per sample, or zero bits per sample such that the total number bits over a predetermined number of samples N is the same as said predetermined number N, and allocation logic means responsive to said R-bit signals stored in said buffer means at a given time to control said average coder means to encode each maximum level noise error sample into an R-bit code, each minimum level noise error sample corresponding to granular noise into zero bits per sample, and all other noise error samples into a single bit.

2. In an ADPCM transmission terminal as defined in claim 1, including a delay means of predetermined time delay coupled between the means for subtracting to obtain a quantization noise error signal and the average coder means.

* * * * *